United States Patent [19]

West et al.

[11] Patent Number: 5,705,309
[45] Date of Patent: Jan. 6, 1998

[54] PHOTOSENSITIVE COMPOSITION AND ELEMENT CONTAINING POLYAZIDE AND AN INFRARED ABSORBER IN A PHOTOCROSSLINKABLE BINDER

[75] Inventors: Paul Richard West, Fort Collins; Jeffery Allen Gurney, Greeley, both of Colo.

[73] Assignee: Eastman Kodak Company, Rochester, N.Y.

[21] Appl. No.: 719,100

[22] Filed: Sep. 24, 1996

[51] Int. Cl.⁶ .................................................. G03F 7/012
[52] U.S. Cl. ................... 430/167; 430/195; 430/196; 430/197; 430/287.1; 430/944
[58] Field of Search .................... 430/281.1, 287.1, 430/944, 167, 195, 196, 197

[56] References Cited

U.S. PATENT DOCUMENTS

| | | |
|---|---|---|
| 3,840,390 | 10/1974 | Kozu et al. ................... 430/287.1 |
| 4,139,390 | 2/1979 | Rauner et al. . |
| 4,622,284 | 11/1986 | West et al. ...................... 430/290 |
| 4,940,646 | 7/1990 | Pawlowski ...................... 430/175 |
| 5,238,777 | 8/1993 | Potts et al. ...................... 430/195 |
| 5,254,431 | 10/1993 | Etherington et al. ............. 430/171 |
| 5,278,023 | 1/1994 | Bills et al. ....................... 430/201 |
| 5,326,670 | 7/1994 | Kotachi et al. .................. 430/296 |

FOREIGN PATENT DOCUMENTS

| | | |
|---|---|---|
| 562952 | 9/1993 | European Pat. Off. . |
| 654711 | 5/1995 | European Pat. Off. . |

*Primary Examiner*—Christopher G. Young
*Attorney, Agent, or Firm*—J. Lanny Tucker

[57] ABSTRACT

An infrared imaging composition comprises three essential components: a photocrosslinkable polymeric binder having pendant photopolymerizable olefinic double bonds, a polyazide photoinitiator and an infrared absorbing compound. These compositions are useful in photosensitive elements such as lithographic printing plates that can be used to provide images using lasers, followed by development.

21 Claims, No Drawings

PHOTOSENSITIVE COMPOSITION AND ELEMENT CONTAINING POLYAZIDE AND AN INFRARED ABSORBER IN A PHOTOCROSSLINKABLE BINDER

FIELD OF THE INVENTION

This invention relates to a photosensitive composition and element that are imageable with a laser. In particular, it relates to a composition and element containing polyazides in photocrosslinkable binders that can be imaged using lasers, and to a method of imaging the element.

BACKGROUND OF THE INVENTION

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image areas retain the water and repel the ink while the image areas accept the ink and repel the water. The ink on the image areas is then transferred to the surface of a material upon which the image is to be reproduced, such as paper, cloth and other materials. Commonly, the ink is transferred to an intermediate material called the blanket which in turn transfers the ink to the surface of the material upon which the image is to be reproduced.

A widely used type of lithographic printing plate has a light-sensitive coating applied to an aluminum base support. The coating may respond to light by having the portion that is exposed become soluble so that it is removed in the developing process. Such a plate is referred to in the art as a positive-working printing plate. Conversely, when that portion of the coating that is exposed becomes hardened, the plate is referred to as a negative-working plate. In both instances, the image areas remaining are ink-receptive or oleophilic and the non-image areas or background are water-receptive or hydrophilic. The differentiation between image and non-image areas is made in the exposure process where a film is applied to the plate under vacuum to insure good contact. The plate is then exposed to a light source, a portion of which is composed of UV radiation. In the instance of negative-working plates, the areas on the film corresponding to the image areas are clear while the areas not struck by light are removed. The light-hardened surfaces of a negative-working plate are therefore oleophilic and will accept ink while the non-image areas that have had the coating removed through the action of a developer are desensitized and are therefore hydrophilic.

Various useful printing plates that can be either negative-working or positive-working are described, for example, in GB 2,082,339 (Horsell Graphic Industries), and U.S. Pat. No. 4,927,741 (Garth et al), both of which describe imaging layers containing an o-quinonediazide and a resole resin, and optionally a novolac resin. Another plate that can be similarly used is described in U.S. Pat. No. 4,708,925 (Newman) wherein the imaging layer comprises a phenolic resin and a radiation-sensitive onium salt. This imaging composition can also be used for the preparation of a direct laser addressable printing plate, that is imaging without the use of a photographic transparency.

Direct digital imaging of offset printing plates is a technology that has assumed importance to the printing industry. The first commercially successful workings of such technology made use of visible light-emitting lasers, specifically argon-ion and frequency doubled Nd:YAG lasers. Printing plates with high photosensitivities are required to achieve acceptable through-put levels using plate-setters equipped with practical visible-light laser sources. Inferior shelf-life, loss in resolution and the inconvenience of handling materials under dim lighting are trade-offs that generally accompany imaging systems exhibiting sufficiently high photosensitivities.

Advances in solid-state laser technology have made high-powered diode lasers attractive light sources for plate-setters. Currently, at least two printing plate technologies have been introduced that can be imaged with laser diodes emitting in the infrared regions, specifically at about 830 nm. One of these is described in EP 573,091 (Agfa) and in several patents and published applications assigned to Presstek, Inc [for example, U.S. Pat. No. 5,353,705 (Lewis et al), U.S. Pat. No. 5,351,617 (Williams et al), U.S. Pat. No. 5,379,698 (Nowak et al), U.S. Pat. No. 5,385,092 (Lewis et al) and U.S. Pat. No. 5,339,737 (Lewis et al)]. This technology relies upon ablation to physically remove the imaging layer from the printing plate. Ablation requires high laser fluences, resulting in lower through-puts and problems with debris after imaging.

A higher speed and cleaner technology is described, for example, in U.S. Pat. No. 5,340,699 (Haley et al), U.S. Pat. No. 5,372,907 (Haley et al), U.S. Pat. No. 5,466,557 (Haley et al) and EP-A-0 672 954 (Eastman Kodak) which uses near-infrared energy to produce acids in an imagewise fashion. These acids catalyze crosslinking of the coating in a post-exposure heating step. Precise temperature control is required in the heating step. The imaging layers in the plates of U.S. Pat. No. 5,372,907 (noted above) comprise a resole resin, a novolac resin, a latent Bronsted acid and an infrared absorbing compound. Other additives, such a various photosensitizers, may also be included.

The use of azides in printing plates designed for imaging with ultraviolet light exposure is well known. Excitation of azides with light results in the elimination of nitrogen gas and the formation of reactive nitrene intermediates. They can be used as photooxidants for print-out purposes as described in U.S. Pat. No. 4,139,390 (Rauner et al). Multifunctional azides are said to improve run-length with post-processing heat treatments of printing plates, as described in U.S. Pat. No. 5,254,431 (Etherington et al). The use of bisazides to crosslink polymers under UV irradiation is also known. Examples of printing plate formulations consisting of a binder resin, a bisazide and a dye absorbing in the visible or near UV region are described, for example, in U.S. Pat. No. 4,940,646 (Pawlowski).

In a different context, polymers with pendant azide groups have been formulated with infrared absorbing compounds for printing plates. The function of the azide groups in such materials has been that of a source of nitrogen gas to assist in the ablative transfer or removal of materials during imaging. Such an approach is disclosed for example in U.S. Pat. No. 5,278,023 (Bills et al) and EP-A-0 562 952 (Vogel). Metal azides have also been formulated with infrared absorbing compounds for ablative imaging as described in U.S. Pat. No. 4,622,284 (West et al).

There is a continuing need in the art for lithographic printing plates that can be imaged in the near infrared at moderate power, and that require relatively simple processing requirements.

SUMMARY OF THE INVENTION

The invention provides an advance in the art by providing photosensitive compositions and elements that are readily imaged using lasers at moderate power, and are then simply processed. Thus, this invention provides a photosensitive composition comprising:

a) a photocrosslinkable polymeric binder having pendant photopolymerizable olefinic double bonds, b) a polyazide photoinitiator, and c) an infrared absorbing compound.

This invention also provides a photosensitive element comprising a support and having thereon the photosensitive composition described above.

Further, a method of providing a negative image comprises the steps of

A) providing a photosensitive element as described above,

B) imagewise exposing the element using a laser to crosslink the photocrosslinkable polymer, and C) developing the exposed element.

It has been found that multifunctional azide compounds can be used to crosslink resins using infrared radiation when formulated with infrared absorbing materials. The essential components include a polyazide, an infrared absorbing compound and a photocrosslinkable polymer that has pendant photocrosslinkable olefinic double bonds. When applied to suitable supports, such as aluminum substrates, printing plates can be provided that give high quality images using modest laser power levels.

DETAILED DESCRIPTION OF THE INVENTION

There are only three essential components of the photosensitive compositions of this invention. The first essential component is a photocrosslinkable polymeric binder that has pendant photopolymerizable olefinic double bonds. There are various types of such useful resins as one skilled in the art would readily understand. One or more such resins (of one or more types) can be used if desired.

A particularly useful group of such resins are defined as having any of structures I, II or III:

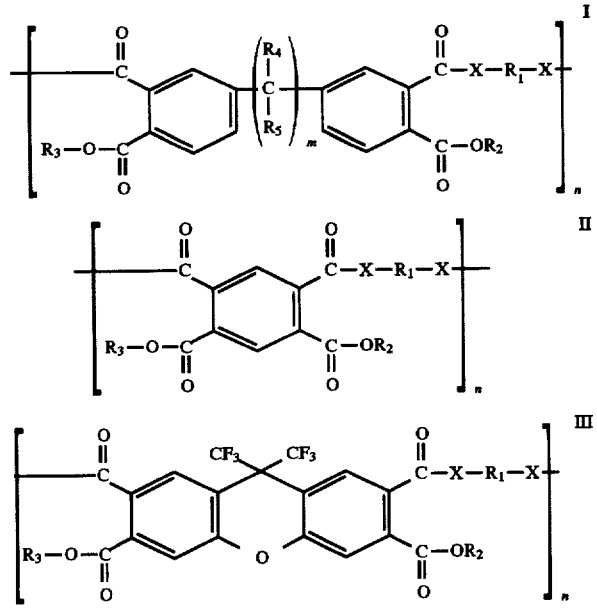

wherein X is —NH—, —O— or —S—, preferably, —NH— or —O—, and most preferably, —NH—.

$R_1$ is a divalent aromatic carbocyclic or heterocyclic group (such as arylene including naphthylene or phenylene, a divalent non-aromatic cycloaliphatic group (such as those having 5 to 10 carbon, sulfur, oxygen or nitrogen atoms, including cycloalkyl groups of 5 to 10 carbon atoms, and heterocyclic groups having 5 to 10 carbon and heteroatoms in the ring, including cyclohexylene, pyridinylene and pyridylene, or a divalent aliphatic group having at least 2 carbon atoms and including aromatic and non-aromatic groups that can also be connected with one or more oxy, amino, thio, carbonyl, oxycarbonyl, carbonyloxy, sulfonyl, sulfonyloxy or oxysulfonyl (such as alkylene, alkyleneoxyalkylene, alkyleneoxyarylene, arylenethioarylene, aryleneoxyarylene, arylenearylene, aryleneaminoarylene, aryleneoryarylene, aryleneoxyalkylene, and others readily apparent to one skilled in the art), or combinations of any of these. Preferably, $R_1$ is arylene or aryleneoxyarylene as defined above, and most preferably, $R_1$ is phenylene or phenyleneoxyphenylene.

$R_2$ and $R_3$ are independently hydrogen or an organic radical containing a photopolymerizable olefinic double bond (such as —CH=CH—CO— or equivalent groups where one or more of the hydrogen atoms is replaced with an alkyl group). Preferably, at least one of $R_2$ and $R_3$ (and more preferably, both) is an organic radical containing a photopolymerizable olefinic double bond that allows for crosslinking. The organic radical can include from 2 to 20 carbon, oxygen and sulfur atoms in the radical backbone, and can be substituted with various groups (such as hydroxy) that would be readily apparent to one skilled in the art. A particularly useful organic radical is —$CH_2CH_2OCOC(CH_3)$=$CH_2$. Other useful organic radicals are described in U.S. Pat. No. 4,416,973 (Goff).

$R_4$ and $R_5$ are independently a hydrocarbon having 1 to 8 carbon atoms (such as substituted or unsubstituted alkyl, cycloalkyl and aryl groups, each of which can be substituted with one or more hydrocarbon groups), perfluoro, or a perhalofluoro aliphatic group having 1 to 8 carbon atoms, or together, $R_4$ and $R_5$ form an oxo group. Preferably, $R_4$ and $R_5$ together form an oxo group. Perfluoro and perhalofluoro aliphatic groups designate groups that contain no hydrogen atoms, and wherein the all hydrogen atoms are substituted with fluoro or other halo atoms. A preferred perhalofluoro aliphatic group is trifluoromethyl, but others would be readily apparent to one skilled in the art.

In structure I, m is 0 or 1, and preferably, m is 1. Also, in each of the structures, n is a positive integer corresponding to the number of units in the polymer and is sufficiently large to provide resin a) with a number average molecular weight of at least about 1500. Preferably, n is sufficiently large to provide a number average molecular weight of from about 1500 to about 35,000.

More details of useful resin a) materials, including methods of preparation, are described in U.S. Pat. No. 4,416,973 (noted above), U.S. Pat. No. 4,454,220 (Goff), DE 2,437,348 (Siemens), and by Horie & Yamashita (Eds.), *Photosensitive Polyimides Fundamentals and Applications*, Technomic Publishing, 1985, Chapter 1 (Ahne and Rubher), each incorporated herein by reference. Two or more of such resins can be used, if desired.

The photosensitive composition also comprises, as a second essential component, one or more photosensitive polyazide photoinitiators. By "polyazide" s meant an organic compound having two or more azide (—$N_3$) groups per molecule. Preferably, the useful polyazides are diazides. Generally, such compounds are non-polymeric, low molecular weight materials.

Particularly useful classes of diazides include, but are not limited to, 4,4'-diazidostilbenes, 4,4'- diazidobenzophenones, 4,4'-diazidobenzalacetophenones, 4,4'-diazidobenzalacetones and 4,4'-diazidobenzalcyclohexanones.

Examples of other useful polyazides include, but are not limited to, 2,4,6-triazido-s-triazine, 2,4-diazido-s-triazine, 2,4-diazido-6-methyl-s-triazine, 2,4,6-triazidopyrimidine, 2,4-diazido-6-methylpyrimidine, 2,4-diazido-6-phenylaminopyrimidine, and the following compounds identified by structure:

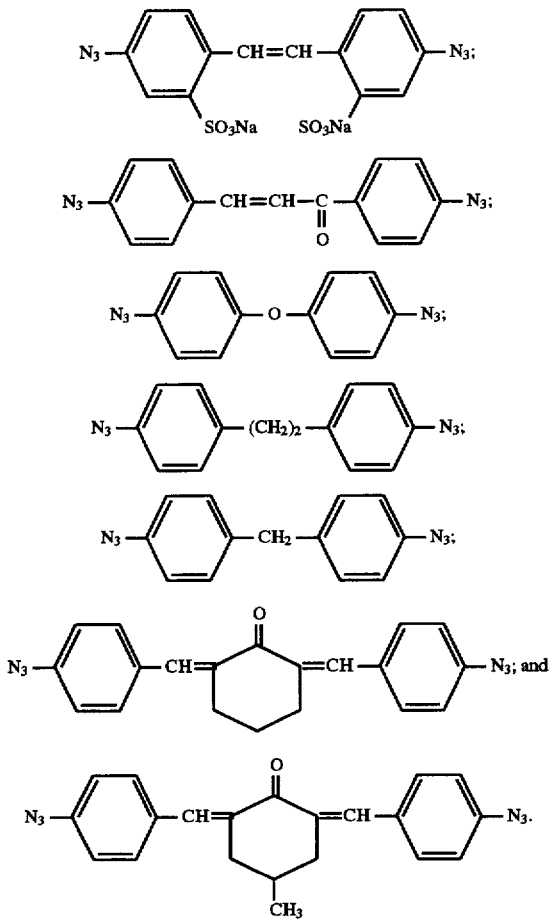

The last compound is preferred in the practice of this invention.

Such compounds are either commercially available from a number of sources, or readily prepared using known procedures (see for example, U.S. Pat. No. 4,139,390 and references cited therein at Col. 5, lines 29–33). Other polyazide compounds are described in several references cited in U.S. Pat. No. 4,940,646 (noted above, see Col. 8, lines 48–50).

The amount of polyazide in the photosensitive composition is generally at least about 5 weight percent (based on total dry weight), and can be up to 40 weight percent.

The third essential component of the photosensitive composition is an infrared absorbing compound, or mixture thereof.

Such compounds typically have a maximum absorption wavelength ($\lambda_{max}$) in the region of at least about 750 nm, that is in the infrared region and near infrared of the spectrum, and more particularly, from about 800 to about 1100 nm. The compounds can be dyes or pigments, and a wide range of compounds are well known in the art (including U.S. Pat. No. 4,912,083, U.S. Pat. No. 4,942,141, U.S. Pat. No. 4,948,776, U.S. Pat. No. 4,948,777, U.S. Pat. No. 4,948,778, U.S. Pat. No. 4,950,639, U.S. Pat. No. 4,950,640, U.S. Pat. No. 4,952,552, U.S. Pat. No. 4,973,572, U.S. Pat. No. 5,036,040 and U.S. Pat. No. 5,166,024). Classes of materials that are useful include, but are not limited to, squarylium, croconate, cyanine (including phthalocyanine), merocyanine, chalcogenopyryloarylidene, oxyindolizine, quinoid, indolizine, pyrylium and metal dithiolene dyes or pigments. Other useful classes include thiazine, azulenium and xanthene dyes. Carbon black and other known inorganic pigments can also be used. Particularly useful infrared absorbing dyes are of the cyanine class.

The amount of infrared absorbing compound in the dried photosensitive layer is generally sufficient to provide an optical density of at least 0.5 in the layer. Preferably, an optical density of from about 1 to about 3. This range would accommodate a wide variety of compounds having vastly different extinction coefficients. Generally, this is at least 1 weight percent, and preferably from 5 to 25 weight percent.

Optional, non-essential components of the photosensitive composition include colorants, sensitizers, stabilizers, exposure indicators and surfactants in conventional amounts. In preferred embodiments, a surfactant (such as silicone material) may be present, but in most preferred embodiments, none of these materials are present.

Obviously, the photosensitive composition is coated out of one or more suitable organic solvents that have no effect on the sensitivity of the composition. Various solvents for this purpose are well known, but cyclohexanone, acetone and 1-methoxy-2-propanol are preferred. The essential components of the composition are dissolved in the solvents in suitable proportions.

Suitable conditions for drying the photosensitive composition involve heating for a period of time of from about 0.5 to about 5 minutes at a temperature in the range of from about 20° to about 150° C.

To form a photosensitive element of this invention, the photosensitive composition is applied (usually by coating techniques) onto a suitable support, such as a metal, polymeric film, ceramics or polymeric-coated paper using conventional procedures and equipment. Suitable metals include aluminum, zinc or steel, but preferably, the metal is aluminum. A most preferred support is an electrochemically grained and sulfuric acid anodized aluminum sheet that has been further treated with an acrylamide-vinylphosphonic acid copolymer according to the teaching in U.S. Pat. No. 5,368,974 (Walls et al). Such elements are generally known as lithographic printing plates, but other useful elements include printed circuit boards.

The thickness of the resulting photosensitive imaging layer, after drying, on the support can vary widely, but typically it is in the range of from about 0.5 to about 2 μm, and preferably from about 1 to about 1.5 μm.

No other essential layers are provided on the element. In particular, there are no protective or other type of layers over the photosensitive imaging layer. Optional, but not preferred subbing or antihalation layers can be disposed under the imaging layer, or on the backside of the support (such as when the support is a transparent polymeric film).

The elements described herein are uniquely adapted for "direct-to-plate" imaging applications. Such systems utilize digitized image information, as stored on a computer disk, compact disk, computer tape or other digital information storage media, or information that can be provided directly from a scanner, that is intended to printed. The bits of information in a digitized record correspond to the image elements or pixels of the image to be printed. This pixel record is used to control the exposure device, that is a modulated laser beam. The position of the laser beam can be controlled using any suitable means known in the art, and turned on and off in correspondence with pixels to be printed. The exposing beam is focused onto the unexposed photosensitive element of this invention. Thus, no exposed and processed films are needed for imaging of the elements, as in the conventional lithographic imaging processes.

Laser imaging can be carried out using any moderate or high-intensity laser diode writing device. Specifically, a laser printing apparatus is provided that includes a mechanism for scanning the write beam across the element to generate an image without ablation. The intensity of the write beam generated at the laser diode source at the element is at least about 10 milliwatts/cm². During operation, the element to be exposed is placed in the retaining mechanism of the writing device and the write beam is scanned across the element to generate an image. Preferably, infrared laser imaging is used in this invention.

Following laser imaging, the element is then developed in a suitable developer solution until the non-image areas are removed to provide the desired negative image. Development can be carried out under conventional conditions for from about 30 to about 120 seconds. One useful aqueous developer solution can be obtained from Eastman Kodak Company as Production Series Developer MX-1587.

After development, the element is optionally treated with a finisher such as gum arabic.

No other post-imaging treatments are necessary in this invention. No floodwise exposure or thermal treatments are needed since the element can be used immediately after laser imaging and development. However, such treatments may optionally be used to provide plates with even longer run lengths.

The following examples are provided to illustrate the practice of this invention, and not to limit it in any manner. Unless otherwise noted, all percentages are by weight.

EXAMPLE 1

A photosensitive coating formulation was prepared as follows:

| COMPONENT | PARTS |
|---|---|
| Polyamic acid derived from benzophenone tetracarboxylic acid dianhydride, oxydianiline and m-phenylenediamine, partially esterified with 2-hydroxy methacrylate | 3.424 |
| 2,6-Di(p-azidobenzal)-4-methylcyclohexanone | 0.856 |
| 2-[2-[2-chloro-3-[(1,3-dihydro-1,1,3-trimethyl-2H-benz[e]indol-2-ylidene)ethylidene-1-cyclohexen-1-yl]ethenyl]-1,1,3-trimethyl-1H-benz[e]indolium, salt with 4-methylbenzenesulfonic acid IR absorbing dye | 0.642 |
| 16% Dispersion of Irgalite Blue GLVO pigment (Ciba Geigy) in toluene and 2-butanone | 0.103 |
| BYK 307 polyether-modified polydimethylsiloxane from BYK-Chemie | 0.011 |
| Cyclohexanone solvent | 45.441 |
| 1-Methoxy-2-propanol solvent | 47.352 |

This formulation was applied to give a dry coating weight of about 1.3 g/m² onto an electrochemically grained and sulfuric acid anodized aluminum sheets that had been further treated with an acrylamide-vinylphosphonic acid copolymer (according to U.S. Pat. No. 5,368,974, noted above) to form unexposed lithographic printing plates.

Three of these plates (A, B and C) were imaged with a 500 milliwatt diode laser (550 mJ/cm² energy dose) emitting a modulated pulse centered at 830 nm. Each plate was processed with Production Series Developer MX-1587 to provide a high resolution negative image. Plate B was then given a 100 unit flood-exposure with an Olec exposure unit in the high intensity mode. Plate C was thermally baked for 5 minutes at 250° C.

All three plates then were mounted on a conventional A. B. Dick printing press, and were used to produce good prints within 10 impressions. The three plates continued to deliver flawless prints after more than 1000 impressions.

EXAMPLE 2

A different photosensitive coating formulation was prepared like that in Example 1 except that 1.338 parts of an 8% dispersion of carbon black in toluene was used in place of the IR absorbing dye and Irgalite Blue GLVO pigment. The resulting printing plate was imaged and processed as described in Example 1 (Plate A), and the resulting image exhibited well resolved 3% highlight dots and 97% shadows.

The invention has been described in detail with particular reference to preferred embodiments thereof, but it will be understood that variations and modifications can be effected within the spirit and scope of the invention.

We claim:

1. A photosensitive composition comprising:

a) a photocrosslinkable polymeric binder having pendant photopolymerizable olefinic double bonds, b) a polyazide photoinitiator that is present in an amount of from 5 to 40 percent (based on dry composition weight), and c) an infrared absorbing compound that has a maximum absorption wavelength in the region of at least 750 nm, and is present in an amount of from 1 to 25 percent (based on dry composition weight).

2. The composition of claim 1 wherein said infrared absorbing compound is a squarylium, croconate, cyanine, merocyanine, indolizine, pyrylium or metal dithiolene dye or pigment that absorbs infrared radiation at a wavelength of from about 800 to about nm.

3. The composition of claim 1 wherein said infrared absorbing compound is present in an amount sufficient to provide an optical density of at least 0.5

4. The composition of claim 1 wherein said photocrosslinkable polymeric binder has any of structures I, II or III:

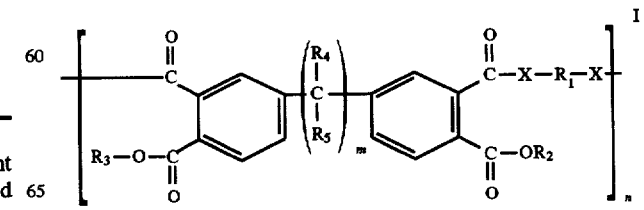

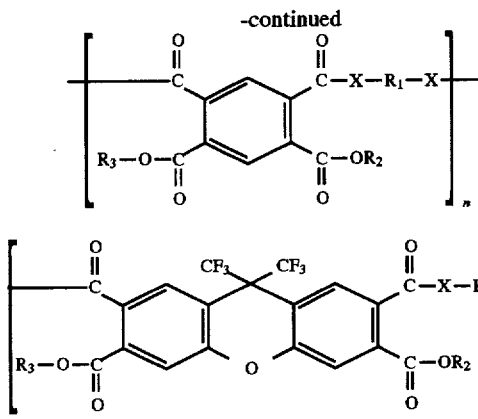

wherein X is —NH—, —O— or —S—, $R_1$ is a divalent aromatic, cycloaliphatic or aliphatic group having at least 2 carbon atoms, $R_2$ and $R_3$ are independently hydrogen or an organic radical containing a photopolymerizable olefinic double bond, provided at least one of $R_2$ and $R_3$ is the organic radical, $R_4$ and $R_5$ are independently a hydrocarbon having 1 to 8 carbon atoms, perfluoro, or a perhalofluoro aliphatic group having 1 to 8 carbon atoms, or together, $R_4$ and $R_5$ form an oxo group, m is 0 or 1, and n is a positive integer corresponding to the number of units in the polymer and is sufficiently large to provide the resin a) with a number average molecular weight of at least about 1500.

5. The composition of claim 4 wherein X is —O— or —NH—, and $R_1$ is arylene or aryleneoxyarylene.

6. The composition of claim 4 wherein both $R_2$ and $R_3$ are organic radicals containing a photopolymerizable olefinic double bond.

7. The composition of claim 4 wherein $R_4$ and $R_5$ are perfluoro or together form an oxo group.

8. The composition of claim 4 wherein n is a positive integer sufficiently large to provide said polymer binder with a number average molecular weight of from about 1500 to about 35,000.

9. The composition of claim 1 wherein said polyazide is a bisazide.

10. The composition of claim 1 wherein said polyazide is a 4,4'-diazidostilbene, 4,4'-diazidobenzophenone, 4,4'-diazidobenzalacetophenone, 4,4'-diazidobenzalacetone or 4,4'-diazidobenzalcyclohexanone.

11. The composition of claim 1 wherein said polyazide is a bisazide selected from the group consisting of:

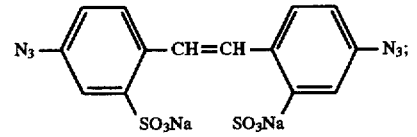

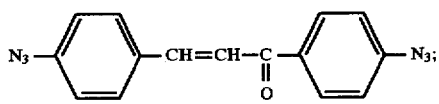

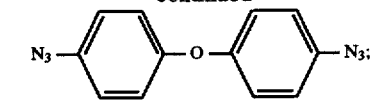

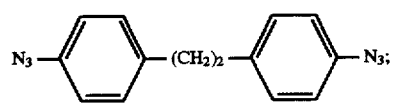

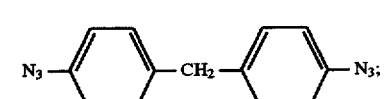

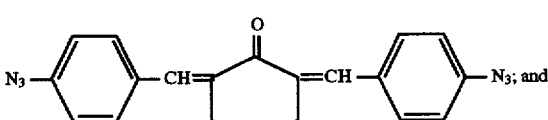

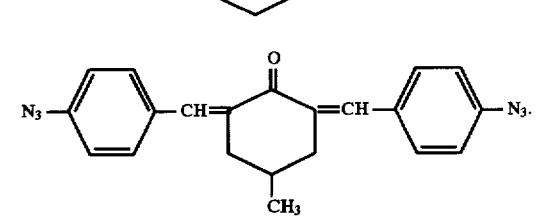

12. The composition of claim 11 wherein said polyazide is

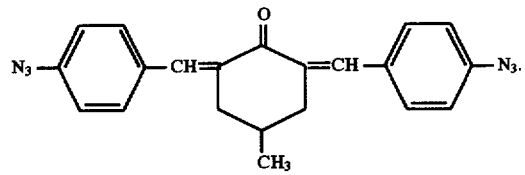

13. The composition of claim 1 wherein said infrared absorbing compound is present in an amount of from 5 to 25% (based on dry composition weight).

14. A photosensitive element comprising a support and having thereon a photosensitive composition comprising:

a) a photocrosslinkable polymeric binder having pendant photopolymerizable olefinic double bonds, b) a polyazide photoinitiator that is present in an amount of from 5 to 40 percent (based on dry composition weight), and c) an infrared absorbing compound that has a maximum absorption wavelength in the region of at least 750 nm, and is present in an amount of from 1 to 25 percent (based on dry composition weight).

15. The element of claim 14 wherein said infrared absorbing compound is a squarylium, croconate, cyanine, merocyanine, indolizine, pyrylium or metal dithiolene dye or pigment that absorbs infrared radiation at a wavelength of from about 800 to about 1100 nm, and is present in said composition in an amount sufficient to provide an optical density of at least 0.5.

16. The element of claim 14 wherein said photocrosslinkable polymeric binder has any of structures I, II or III:

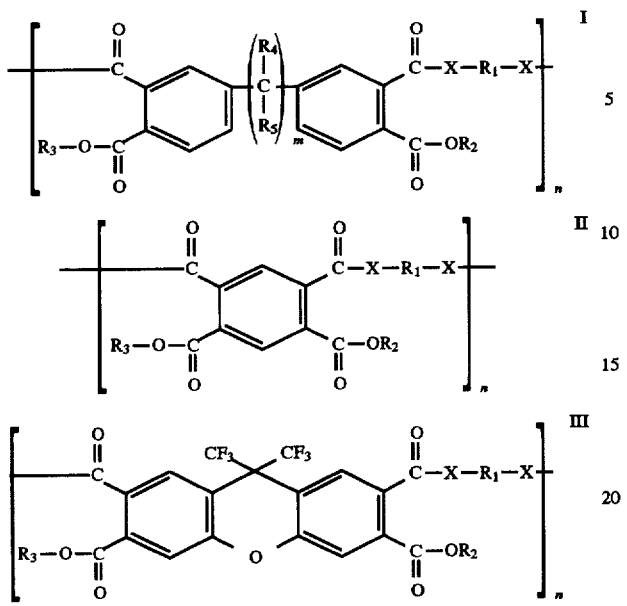

wherein X is —NH—, —O— or —S—, $R_1$ is a divalent aromatic, cycloaliphatic or aliphatic group having at least 2 carbon atoms, $R_2$ and $R_3$ are independently hydrogen or an organic radical containing a photopolymerizable olefinic double bond, provided at least one of $R_2$ and $R_3$ is the organic radical, $R_4$ and $R_5$ are independently a hydrocarbon having 1 to 8 carbon atoms, perfluoro, or a perhalofluoro aliphatic group having 1 to 8 carbon atoms, or together, $R_4$ and $R_5$ form an oxo group, m is 0 or 1, and n is a positive integer corresponding to the number of units in the polymer and is sufficiently large to provide the resin a) with a number average molecular weight of at least about 1500.

17. The element of claim 16 wherein X is —O— or —NH—, and $R_1$ is arylene or aryleneoxyarylene, both $R_2$ and $R_3$ are organic radicals containing a photopolymerizable olefinic double bond, $R_4$ and $R_5$ are perfluoro or together form an oxo group, and n is a positive integer sufficiently large to provide said polymer binder with a number average molecular weight of from about 1500 to about 35,000.

18. The element of claim 14 wherein said polyazide is a bisazide selected from the group consisting of a 4,4'-diazidostilbene, 4,4'-diazidobenzophenone, 4,4'-diazidobenzalacetophenone, 4,4'-diazidobenzalacetone and 4,4'-diazidobenzalcyclohexanone.

19. The element of claim 14 wherein said polyazide is a bisazide selected from the group consisting of:

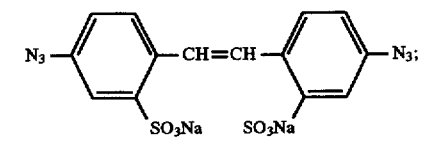

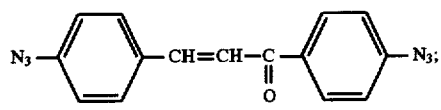

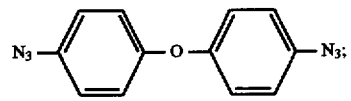

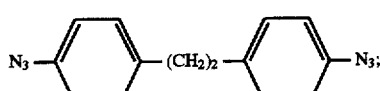

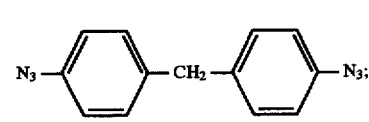

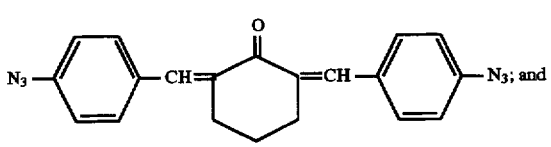

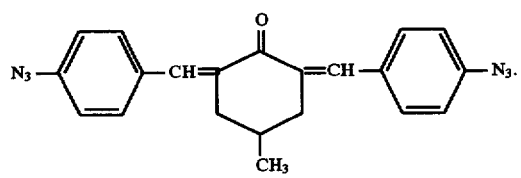

20. The element of claim 19 wherein said polyazide is

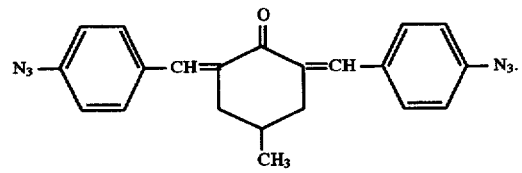

21. The element of claim 14 wherein said infrared absorbing compound is present in an amount of from 5 to 25% (based on dry composition weight).

* * * * *

UNITED STATES PATENT AND TRADEMARK OFFICE
CERTIFICATE OF CORRECTION

PATENT: 5,705,309
DATED: JAN 6, 1998
INVENTOR(S): Paul R. West, et al It is certified that an error appears in the above-identified patent and that said Letters Patent is hereby corrected as shown below:

COL. 8, LINE 50      insert therefor after "about" -- 1100 --

Signed and Sealed this

Seventeenth Day of March, 1998

*Attest:*

BRUCE LEHMAN

*Attesting Officer*      *Commissioner of Patents and Trademarks*